(12) United States Patent
Furuyama

(10) Patent No.: US 8,175,133 B2
(45) Date of Patent: May 8, 2012

(54) LASER-INDUCED OPTICAL WIRING APPARATUS

(75) Inventor: Hideto Furuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/642,428

(22) Filed: Dec. 18, 2009

(65) Prior Publication Data

US 2010/0098129 A1    Apr. 22, 2010

Related U.S. Application Data

(62) Division of application No. 11/735,570, filed on Apr. 16, 2007, now Pat. No. 7,656,928.

(30) Foreign Application Priority Data

Jan. 5, 2007    (JP) ................................. 2007-000720

(51) Int. Cl.
*H01S 3/083* (2006.01)
(52) U.S. Cl. ................ 372/94; 372/93; 372/92; 372/99; 372/43.01
(58) Field of Classification Search .................... 372/94, 372/93, 92, 99, 43.01
See application file for complete search history.

(56) References Cited

U.S. PATENT DOCUMENTS

| | | | | |
|---|---|---|---|---|
| 4,271,536 A | * | 6/1981 | Copeland | ........................ 398/214 |
| 5,446,579 A | * | 8/1995 | Lomashevitch | .............. 359/333 |
| 5,991,488 A | | 11/1999 | Salamon et al. | |
| 7,421,002 B2 | | 9/2008 | Furuyama | |
| 2003/0179974 A1 | * | 9/2003 | Estes et al. | ........................ 385/2 |
| 2003/0223202 A1 | * | 12/2003 | Uchida | .......................... 361/760 |
| 2009/0080480 A1 | | 3/2009 | Furuyama | |

FOREIGN PATENT DOCUMENTS

| | | |
|---|---|---|
| JP | 6-132516 | 5/1994 |
| JP | 2004-294543 | 10/2004 |

OTHER PUBLICATIONS

Ozeki et al., "Half-duplex optical transmission link using an LED source-detector scheme," Optics Letters, Optical Society of America, vol. 2, No. 4, pp. 103-105, Apr. 1978.

* cited by examiner

*Primary Examiner* — Kinam Park
(74) *Attorney, Agent, or Firm* — Oblon, Spivak, McClelland, Maier & Neustadt, L.L.P.

(57) ABSTRACT

A laser-induced optical wiring apparatus is provided wherein optical wiring is realized by digital operations of a laser oscillator. The apparatus includes optical ring resonator formed of a loop-shaped optical waveguide on substrate. At least two optical gain sections are provided on the optical ring resonator. When each optical gain section is activated, a laser oscillator including the optical ring resonator and optical gain sections is enabled to oscillate. In this state, the gain of at least one of the optical gain sections is changed in accordance with an input signal, thereby changing the optical route gain of the optical ring resonator to change the oscillation state of the laser oscillator. A change in the laser oscillation state is detected by the optical gain section other than the at least one optical gain section, whereby an output signal is acquired.

12 Claims, 9 Drawing Sheets

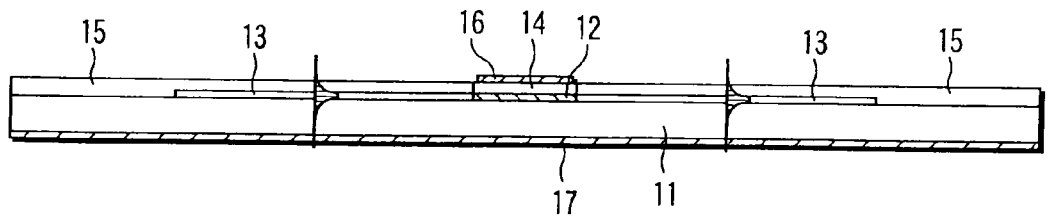
F I G. 1
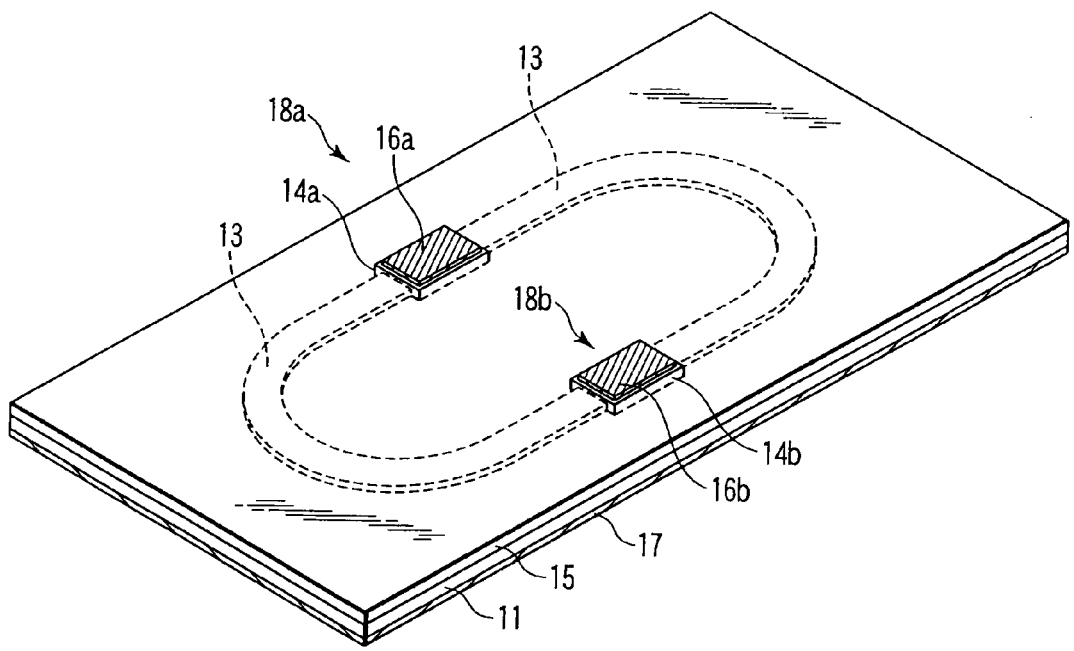
F I G. 2
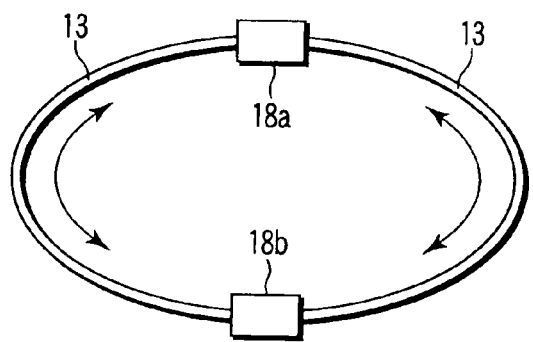
F I G. 3

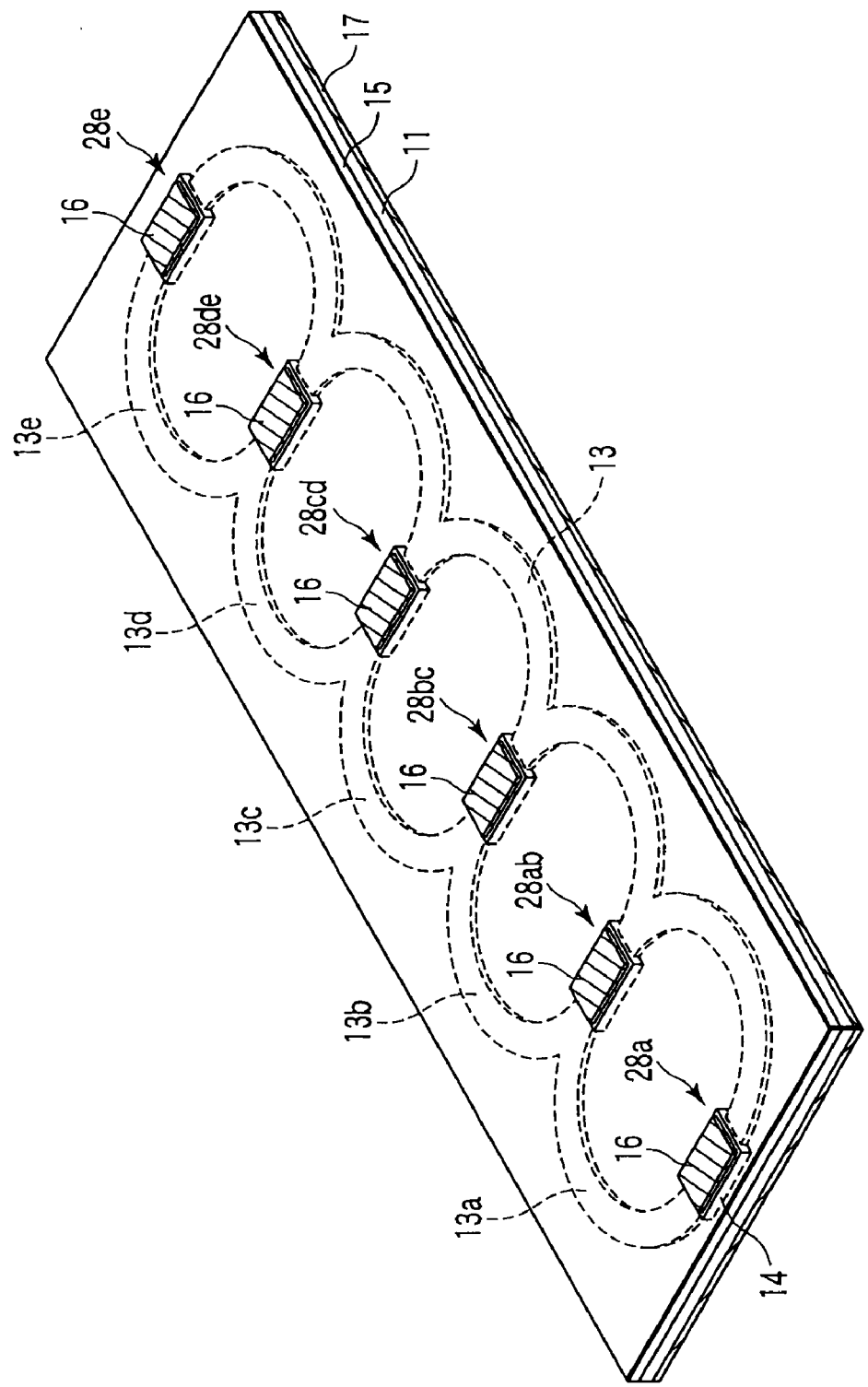
F I G. 12

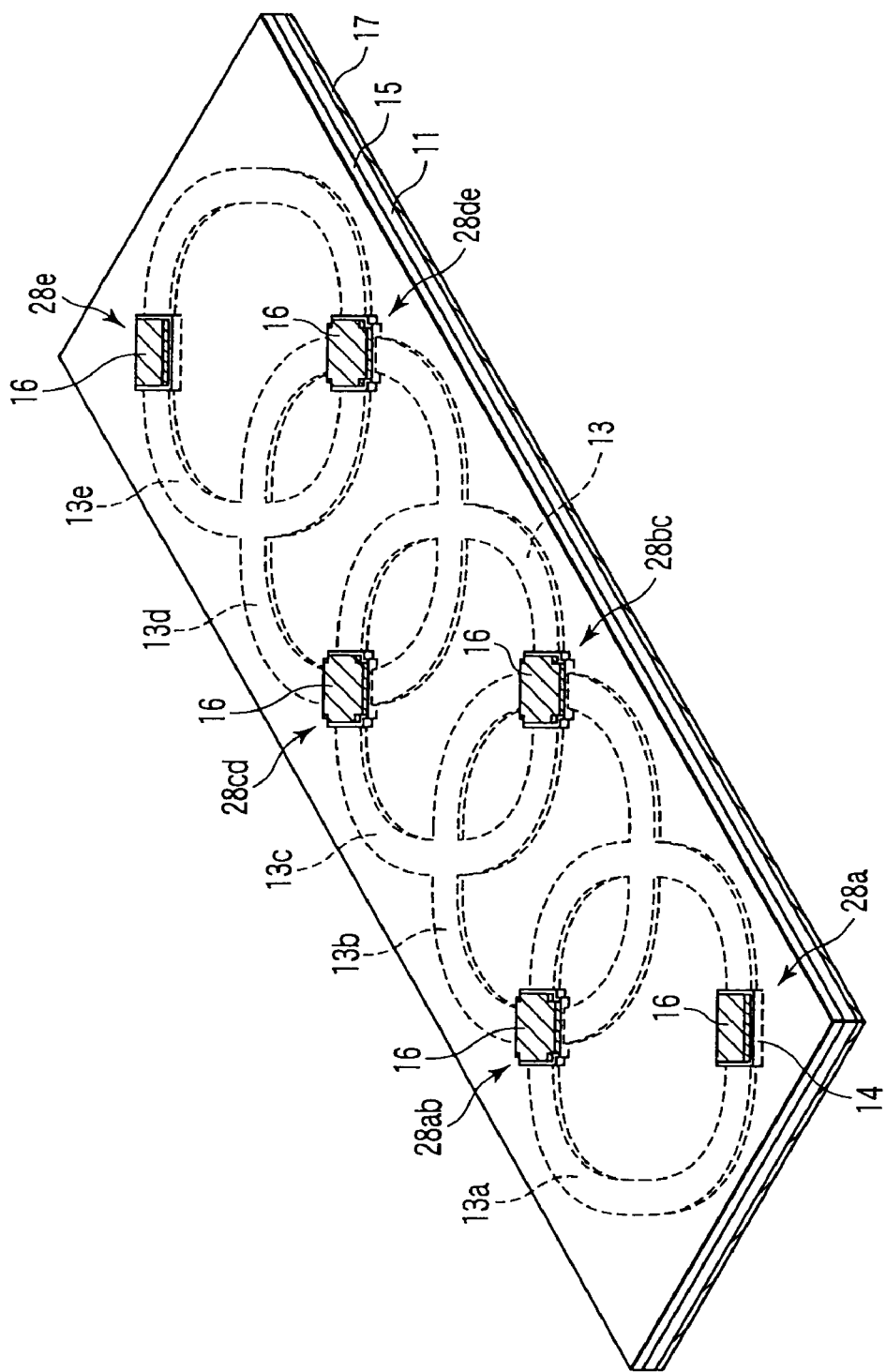
F I G. 15

LASER-INDUCED OPTICAL WIRING APPARATUS

CROSS-REFERENCE TO RELATED APPLICATIONS

This application is a divisional of U.S. Ser. No. 11/735,570 filed Apr. 16, 2007, which claims priority under 35 U.S.C. 119 to Japanese Patent Application No. 2007-000720, filed Jan. 5, 2007, the entire contents of both of which are incorporated herein by reference.

BACKGROUND OF THE INVENTION

1. Field of the Invention

The present invention relates to an on-chip optical wiring technique for realizing the wiring of, for example, an LSI chip utilizing light, and more particularly, to a laser-induced optical wiring apparatus in which optical wiring is realized by the digital operations of a laser oscillator.

2. Description of the Related Art

Drastic enhancement of the operation speed of LSIs has been achieved by the enhancement of performance of electronic devices, such as bipolar transistors and field effect transistors. However, while the performance of electronic devices is enhanced by the microfabrication of transistors, the wiring resistance or inter-wiring capacitance in the devices is increased as a result of the microfabrication. The increases in the wiring resistance or inter-wiring capacitance are becoming a bottleneck in the increase of the performance of LSIs.

In consideration of such a problem in electric wiring as the above, several optical wiring LSIs, in which light is used to connect elements in the LSIs, have been proposed (see, for example, JP-A H6-132516(KOKAI). Optical wiring is almost free from the dependency of loss upon frequency regardless of whether the current supplied thereto is a direct current or an alternating current of 100 GHz or more, and from disorder in wiring paths due to electromagnetism.

However, such a conventional technique as that of JP-A H6-132516(KOKAI) exhibits significantly low reproducibility and reliability if it is applied to LSIs with an extremely large number of wires. For instance, even if it is assumed that optical wiring is employed only for the uppermost layer (global layer) of LSI wiring, one LSI chip may well include several hundreds of optical wires. In this case, to operate one LSI, it is necessary to operate several hundreds of optical wires with all the wires kept in good condition. In light of the manufacturing yield of LSIs, this means that reproducibility and reliability are required for the production technique, which enable no single defective optical wire to be contained in several tens of thousands to several hundreds of thousands of optical wires produced. Thus, each optical wire for LSIs must have extremely high reproducibility and reliability. To this end, each optical wire must have an extremely simple structure and an extremely small size for highly integration.

Basically, a light-emitting element, optical waveguide and light-receiving element are essential elements for the conventional optical wiring. Accordingly, light-emitting element techniques, light-receiving element techniques and optical waveguide techniques are necessary. It is also necessary to make a complete survey of various techniques including peripheral techniques, such as optical coupling techniques for efficiently optically coupling the light-emitting element to the light-receiving element, and optical transmission system designing techniques. Moreover, those basic elements differ from each other in operation principle, material, structure, processing technique, and hence it is necessary to delicately combine materials and processing techniques to form optical wiring. This process is extremely difficult to realize.

As described above, in conventional optical wiring techniques, since the structural elements are very complex, and various materials must be used to form the elements, problems will easily occur in the stability or reproducibility of the characteristics. Furthermore, it is difficult to reduce the size of the wiring. Thus, the conventional optical wiring techniques include a large number of unsuitable factors for LSI wiring.

BRIEF SUMMARY OF THE INVENTION

In accordance with a first aspect of the invention, there is provided a laser-induced optical wiring apparatus comprising:

a substrate;

an optical waveguide of a loop-shaped provided on the substrate and forming an optical ring resonator;

an optical gain section provided across a portion of the optical waveguide and forming a laser oscillator along with the optical ring resonator; and an optical switch provided across a portion of the optical waveguide separately from the optical gain section, the optical switch performing a switching operation to change a loss of an optical path of the optical ring resonator upon receiving a signal to change a laser oscillation state of the laser oscillator.

In accordance with a second aspect of the invention, there is provided a laser-induced optical wiring apparatus comprising:

a substrate;

an optical waveguide of a loop-shaped provided on the substrate and forming an optical ring resonator;

a first optical gain section provided across a portion of the optical waveguide; and a second optical gain section provided across a portion of the optical waveguide separately from the first optical gain section, the first and second optical gain sections forming a laser oscillator along with the optical ring resonator.

In accordance with a third aspect of the invention, there is provided a laser-induced optical wiring apparatus comprising:

a substrate;

an optical waveguide provided on the substrate and forming an optical resonator; and at least three optical gain sections provided across portions of the optical waveguide separately from each other, the optical gain sections forming a laser oscillator along with the optical resonator, wherein one of the optical gain sections is used as an output optical gain section, while the other optical gain sections are used as input optical gain sections, and the output optical gain section and the input optical gain sections are activated to enable the laser oscillator to oscillate, a change in a laser oscillation state of the laser oscillator caused by a change in an activation level of each of the input optical gain sections being detected by the output optical gain section, thereby acquiring a logical output corresponding to a signal input to said each input optical gain section.

BRIEF DESCRIPTION OF THE SEVERAL VIEWS OF THE DRAWING

FIG. 1 is a schematic sectional view illustrating the structure of a laser-induced optical wiring apparatus according to a first embodiment;

FIG. 2 is a schematic perspective view illustrating the structure of the laser-induced optical wiring apparatus of the first embodiment;

FIG. 3 is a schematic functional block diagram illustrating the structure of the laser-induced optical wiring apparatus of the first embodiment;

FIG. 12 is a schematic perspective view illustrating the structure of a laser-induced optical wiring apparatus according to a fifth embodiment;

FIG. 15 is a schematic perspective view illustrating the structure of a laser-induced optical wiring apparatus according to a sixth embodiment;

DETAILED DESCRIPTION OF THE INVENTION

Figure 4:
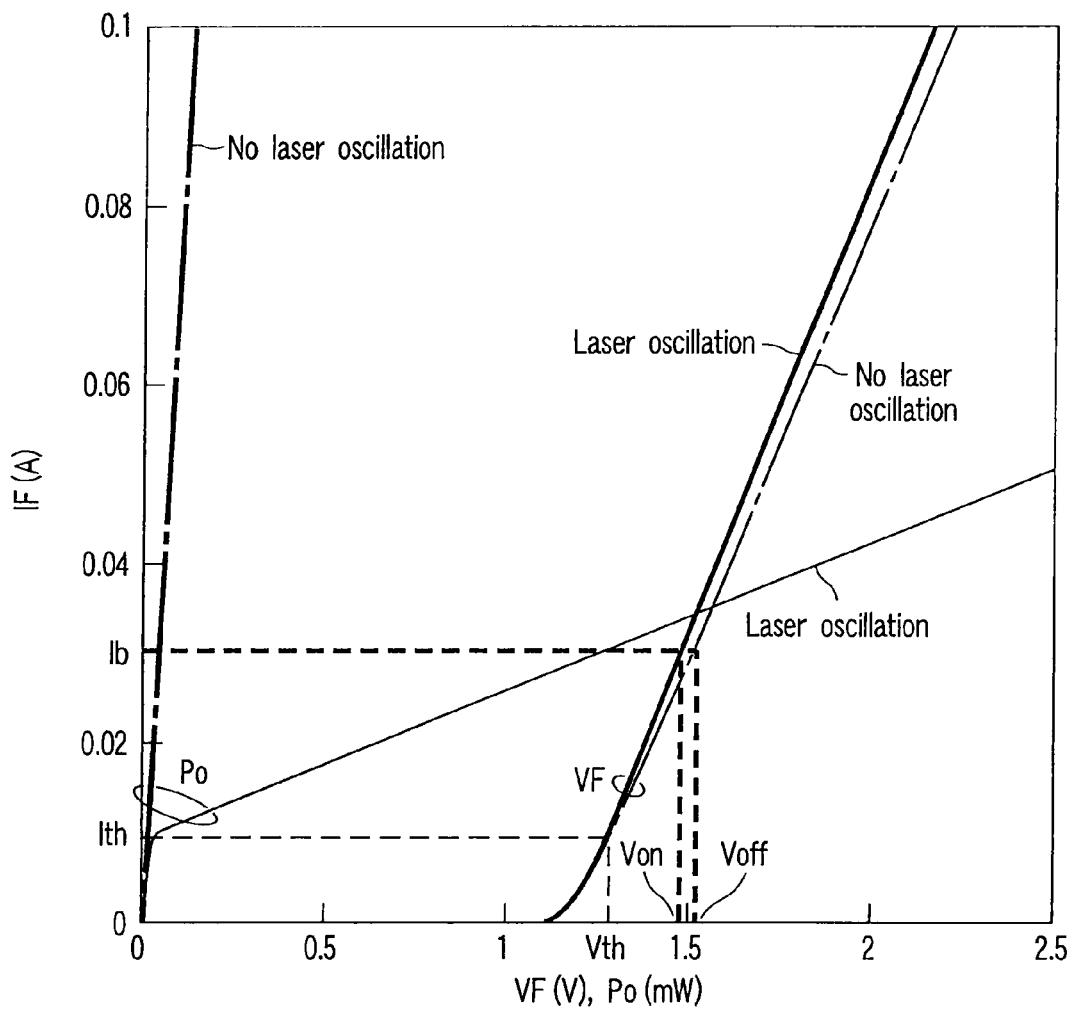
FIG. 4 is a graph illustrating laser oscillation characteristic examples of the laser-induced optical wiring apparatus of the first embodiment.

The gist of embodiments of the present invention does not lie in one-way light transmission operation performed by, for example, a light emission element (light transmission), optical waveguide (light transfer) and light receiving element (light reception), but lies in that a light emitting element, optical waveguide and another light emitting element are spatially distributed and made to cooperate to serve as a single system including two single laser oscillators, and each laser operation of the system is transmitted as a signal. This enables two states whether or not the system performs laser oscillation to be used as two signals, thereby realizing digital operations and hence optical wiring of a high operational margin. Namely, utilizing the fact that when there is an operation slower than the standard operation speed of the system, this operation is instantly transmitted to the whole system, transmission of a signal to a spatially separate place is realized. At this time, one of the light emitting elements is made to function as an optical switch for controlling the optical gain (or loss) of the system including the two laser oscillators, and the other element is made to function as a receiver for receiving and transmitting, to the outside, variations in, for example, excited carriers corresponding to variations in the optical amount of the whole system.

A detailed description will be given of the present invention, using the embodiments shown in the accompanying drawings. In the embodiments, several specific materials are employed. However, the invention is not limited to them. It is sufficient if the material can perform laser oscillation. Accordingly, the invention is not limited to the embodiments described below. Further, in the embodiments, one or several optical wires are described. Actually, however, a large number of optical wires are integrated on an LSI chip. Any arbitrary number of optical wires may be employed.

First Embodiment

FIG. 1 is a schematic perspective view illustrating the structure of a laser-induced optical wiring apparatus according to a first embodiment. FIG. 1 shows only elements necessary for optical wiring. Further, FIG. 2 shows the cross section taken along the axis of the apparatus of FIG. 1. Although the first embodiment employs GaInAsP/InP-based materials as material examples of the apparatus, it may employ other materials, such as GaAlAs/GaAs-based materials, Si and SiGe/Si.

In FIGS. 1 and 2, reference number 11 denotes an n-type InP substrate, reference number 12 denotes a GaInAsP active layer (laser medium having an emission wavelength of 1.3 µm), reference number 13 denotes a GaInAsP optical waveguide core (having, for example, a band gap wavelength of 1.2 µm), reference numbers 14a and 14b denote p-type InP layers, and reference number 15 denotes a semi-insulated clad layer (e.g., an Fe-doped InP layer). Further, reference numbers 16a and 16b denote p-side electrodes (formed of, for example, AuZn), and reference number 17 denotes an n-side electrode (formed of, for example, AuGe).

On the InP substrate 11, the GaInAsP optical waveguide core 13 is formed in the formed of a loop, thereby forming a ring optical resonator. The semi-insulated clad layer 15 is provided on the optical waveguide core 13 and substrate 11. Two portions of the optical waveguide core 13 are substituted of the GaInAsP active layers 12, and two portions of the semi-insulated clad layer 15 on the active layers 12 are substituted of the p-type InP layers 14a and 14b. The p-side electrodes 16a, 16b are formed on the InP layers 14a and 14b, respectively, and the n-side electrode 17 is provided on the lower surface of the substrate 11. Namely, a first optical gain section 18a and second optical gain section 18b, which form a laser oscillator, is provided across the optical waveguide core 13.

Assume here that each active layer 12 has, for example, a thickness of 0.12 µm, a width of 1 µm, and a length of 50 µm. Further, assume that the optical waveguide core 13 has, for example, a thickness of 0.12 µm and a width of 1 µm. The active layers 12 and optical waveguide core 13 may have a quantum well structure. The length of the optical waveguide core 13 serves as a parameter for determining the maximum operation frequency of the laser oscillator. If it is longer than a certain value, the operation speed of the optical wiring apparatus is limited. This will be explained later. Further, assume that the radius of curvature of the optical waveguide core 13 is set so that the optical waveguide loss falls within a certain allowable range. Specifically, the radius of curvature is determined in view of refractive index differences and optical losses in the optical waveguide, the gain of the laser oscillator, etc.

As shown in FIG. 1, the active layers 12 are directly connected to the optical waveguide core 13. As shown in FIG. 2, the two active layers 12 (not shown) surrounded by the p-type InP layers 14 and semi-insulated clad layer 15 are optically coupled to each other by the ring optical waveguide core 13. The active layers 12 and optical waveguide core 13 may be sequentially formed by crystal growth and patterning. Alternatively, firstly, crystal growth may be made using a composition control technique using selective growth, such as a multi-quantum-well structure, and then the resultant structure be patterned into the layers 12 and core 13.

Further, a diffraction grating may be provided near the upper, lower, right or left portion of each active layer 12 to form a distributed Feed Back (DFB) laser structure. Alternatively, a diffraction grating may be provided at the portion of the optical waveguide core 13 near each optical gain section (each region in which elements 17, 11, 12, 14 and 16 are stacked on each other), or in the halfway of the optical waveguide core 13, to form a distributed Bragg Reflector (DBR) laser structure. When these laser structures are employed, the laser oscillation threshold value can be reduced. When the DFB or DBR laser structure is employed, even only one of the active layers 12 can oscillate in principle. However, to realize a cooperative operation of the active layers 12, the oscillation threshold value for each active layer is set relatively high.

The operation principle of the laser-induced optical wiring apparatus constructed as the above will now be described.

FIG. 3 is a block diagram illustrating the laser-induced optical wiring apparatus shown in FIGS. 1 and 2, using blocks and wire connection. In FIG. 3, reference number 13 denotes the optical waveguide core (optical line), and reference numbers 18a and 18b denotes optical gain sections (regions in which elements 17, 11, 12, 14 and 16 are stacked on each other in FIGS. 1 and 2). These reference numbers do not denote actual configurations, but denote functional blocks. For facilitating the description, the optical gain sections 18, which employ a simple ring optical coupling structure instead of the DRB or DBR structure, will be described. Note that even when the optical gain sections 18 employ the DRB or DBR structure, they can operate in the same way as in the first-mentioned case by adding conditions for optical phase adjustment related to the diffraction grating.

When both the optically coupled gain sections 18a and 18b are excited (by supplying current thereto) as shown in FIG. 3, the internal optical intensity distribution is substantially uniform, and an optical revolution gain of 1 is acquired, i.e., laser oscillation is enabled. Assume here that the length of the 18a-side active layer 12, the length of the 18b-side active layer 12, the induced emission gain (optical gain) of the 18a-side active layer 12, the induced emission gain (optical gain) of the 18b-side active layer 12, the entire length of the optical waveguide core 13, the absorption loss coefficient of the optical waveguide core 13, the coupling coefficient between the optical waveguide core 13 and the 18a-side active layer 12, and the coupling coefficient between the optical waveguide core 13 and the 18b-sdie active layer 12 are used as characteristic parameters La, Lb, ga, gb, αa, αb, Lt, αt, Ca and Cb, respectively. In this case, the laser oscillation condition for the entire system is that under which light can maintain its initial intensity even after making a circuit of the system. Namely, the following equation must be satisfied:

$$2 \ln \{1/(Ca \times Cb)\} = (ga \times La + gb \times Lb - \alpha a \times La - \alpha b \times Lb - \alpha t \times Lt) \quad (1)$$

where ga and gb are functions concerning carriers (current) injected into the active layers 12, and the other parameters are fixed if the structure is fixed. Accordingly, the laser oscillation condition is that the optical gain based on ga and gb exceeds the optical loss of the system. It is sufficient if the following relationship is established:

$$ga(IFa)La + gb(IFb)Kb = \alpha a \times La + \alpha b \times Lb + \alpha t \times Lt - 2 \ln(Ca \times Cb) \quad (2)$$

where IFa and IFb represent activation currents for the optical gain sections 18a and 18b, respectively.

FIG. 4 shows laser oscillation characteristic examples of the structure of FIG. 3 acquired when Ca=Cb=100%, IFa=IFb=IF/2, i.e., the same current is passed through the optical gain sections 18a and 18b. In FIG. 4, the abscissa indicates the element voltage (VF) and the optical monitor output (Po) acquired by the optical coupling probe (coupling efficiency of 20%), while the ordinate indicates the sum (IF=IFa+IFb) of the currents passing through the optical gain sections 18a and 18b. In FIG. 4, two lines of Po indicate the case where the system of FIG. 3 performs laser oscillation, and the case where the system does not perform laser oscillation. Similarly, the two lines of VF indicate those cases. The characteristics corresponding to no laser oscillation are acquired by interrupting optical coupling of the optical gain sections 18a and 18b by etching (i.e., by non-perpendicular etching so as to avoid optical coupling) the halfway of the optical waveguide 13. In any case, the electrical characteristics of the optical gain sections 18a and 18b do not change.

In FIG. 4, the point at which Po abruptly increases indicates the threshold values for laser oscillation. Specifically, the threshold values are the current threshold value Ith, and the voltage threshold value Vth. FIG. 4 shows the characteristics acquired when symmetrical activation of IFa=IFb is performed. If IFa≠IFb, the resultant current and voltage threshold values may well be deviated from Ith and Vth in FIG. 4 because of the nonlinear characteristic of gain g (IF).

The optical gain sections 18a and 18b serve as diodes held between the p-type clad layers 14a and 14b and the n-type clad layer (substrate) 11, respectively, and their current/voltage characteristic is given by $$I = I0[\exp\{(V - I \times Rs)e/n \times k \times T\}] \quad (3)$$

where Rs is the internal resistance of a pn-junction diode formed of the elements 16, 14, 12, 11 and 17, I0 is a saturation current, n is a constant for the diode, k is the Boltzmann constant, and T is the absolute temperature. The following equation can be extracted from equation (3):

$$V1 = \{\ln(I1/I0)\} n \times k \times T/e + I1 \times Rs (I1 < Ith) \quad (4)$$

In general, when a semiconductor layer performs laser oscillation, the active layer voltage (junction potential) is fixed at the threshold voltage, therefore the element voltage is given by $$V2 = \{\ln(Ith/I0)\} n \times k \times T/e + I2 \times Rs (I2 > Ith) \quad (5)$$

In this case, the first term serves as a constant for the current. Assume here that only optical coupling between the optical gain sections 18a and 18b is changed to switch the state between the laser oscillation state and non-oscillation state. Further, I1=L2=Lb is replaced with the above-mentioned V1 and V2, and the difference between V1 and V2 is set to ΔV, thereby acquiring the following equation:

$$\Delta V = \{\ln(Ib/Ith)\} n \times k \times T/e \quad (6)$$

ΔV is equal to the difference (Voff−Von) between Voff and Von. In a semiconductor laser element, if the state can be switched between the laser oscillation state and non-oscillation state, with the current flown therethrough kept constant, this means that the voltage of the element varies. In contrast, if the element bias voltage is kept constant, the current flowing through the element varies.

This phenomenon serves as the principle of the laser-induced optical wiring apparatus of the embodiment. Namely, two active layers each having one side functioning as a reflection mirror are optically coupled into a laser oscillator, whereby the laser oscillation state of the entire system is varied by a variation caused in one of the active layers, which results in a variation in the other active layer. In other words, when the two active layers are located separately, a variation caused in one of the active layers is transmitted to the other active layer, with the result that some sort of variation can be extracted from the other active layer. Thus, the laser oscillator can have a signal transmission function.

A description will be given of an operation method example for use in the embodiment.

In the basic operation of the laser-induced optical wiring apparatus of the embodiment, the optical gain sections 18a and 18b are activated to made the laser oscillator formed of the ring optical resonator and optical gain sections 18a and 18b in an oscillation enabled state (in an oscillating state or in a state, immediately before oscillation, in which a bias is applied). At the same time, a signal is input to change the activation level of one of the optical gain sections 18a and 18b to thereby switch the optical path gain of the ring optical resonator, thereby changing the oscillation state of the laser oscillator. The change in the laser oscillation state is detected by the other optical gain section 18a to acquire an output signal.

Firstly, Ib/2 is supplied as a bias current to the electrodes 16a and 16b to thereby set the system in the laser oscillation state (as indicated by the laser oscillation lines of FIG. 4). Subsequently, a signal is supplied to one of the electrodes 16a and 16b. For instance, −Ib/2 as a signal is supplied to the electrode 16a, thereby offsetting the bias current supplied to the electrode 16a. At this time, the laser oscillation of the system is stopped, and the voltage at the electrode 16b increases from Von to Voff. Assuming that Ith=10 mA and Ib=30 mA, the threshold current and bias current of the active layers 12a and 12b are 5 mA and 15 mA, respectively. Further, assuming that the diode constant (n) is 2, ΔV (Voff−Von) is about 57 mV.

The above-described signal supply may also be made to the electrode 16b. In this case, a signal voltage occurs at the electrode 16a. Namely, in the above bias- and signal-supply process, a signal voltage of about 50 mV occurs at the electrode other than that to which a signal is supplied. The active layer of the electrode, to which a signal is supplied, is switched from the gain-on state to the gain-off state and functions as an optical switch. Thus, in the embodiment of FIGS. 1 to 3, one of the electrodes functions as an optical switch, and the other electrode functions as an optical-gain/signal-receiving section. These functions can be switched from each other, namely, bidirectional transmission can be achieved.

The limit set on the phenomenon that a variation in one active layer appears as a variation in the other active layer will be described. Lasers utilize stimulated emission phenomenon, and it is an essential requirement to apply light to an activated laser medium. Accordingly, when two active layers are located separately and a laser oscillator is formed therebetween as in the first embodiment, stimulated emission occurs, delayed by the time corresponding to the optical transmission time between the active layers. This means that the time corresponding to the delay time is required for starting the laser oscillation operation. Therefore, in the laser-induced optical wiring apparatus of the embodiment, it is difficult for the laser oscillator to operate in a shorter time than the time required for light goes round the laser cavity.

However, in the example of FIG. 1, assuming that the effective reflectance of the active layers and optical waveguide is 3.5, and the laser oscillator length is about 1 mm, the time required for light to make a circuit of the system is about 23 ps, and the maximum response speed is about 40 GHz. Namely, signals of about ten and several GHz can be sufficiently processed. In the case of non-return-to-zero (NRZ) signals for general logic data, signals of about 20 Gbps can be processed.

As described above, in the first embodiment, the optical waveguide 13 providing the ring optical resonator is provided on the substrate 11, and the first and second active layers 12 are provided on portions of the optical waveguide 13, whereby the emission elements and optical waveguide serve as base elements for optical wiring. This realizes a significant simple structure that does not require a dedicated light-receiving element. Further, system designing requires simple digital operation designing that considers only laser operation, namely, operation designing of setting the laser oscillation state and non-oscillation state to "1" and "0", respectively. As a result, complex optical transmission designing, such as setting of optical transmission/receiving levels based on least receiving sensitivity or optical coupling efficiency, is not necessary. Furthermore, wiring is designed to enable the above-mentioned simple digital operation utilizing the laser oscillation state and non-oscillation state, and is therefore designed with high margin.

Accordingly, the required structural elements for optical wiring are significantly simplified to thereby reduce the factors of variation or failure. Further, the operational margin of the system is significantly enhanced to thereby remarkably reduce the frequency of occurrence of defects in characteristics. Namely, the characteristic reproducibility or reliability of optical wiring can be drastically enhanced, and the practical utility of LSI on-chip optical wiring can be greatly enhanced, which significantly contributes to high integration of, for example, information communication devices.

Further, in the first embodiment, the active layers 12 serves as an optical gain unit for providing a laser oscillator, and also as a signal receiving unit for detecting emission states. As a result, bidirectional signal transmission is possible.

Second Embodiment

Figure 5:
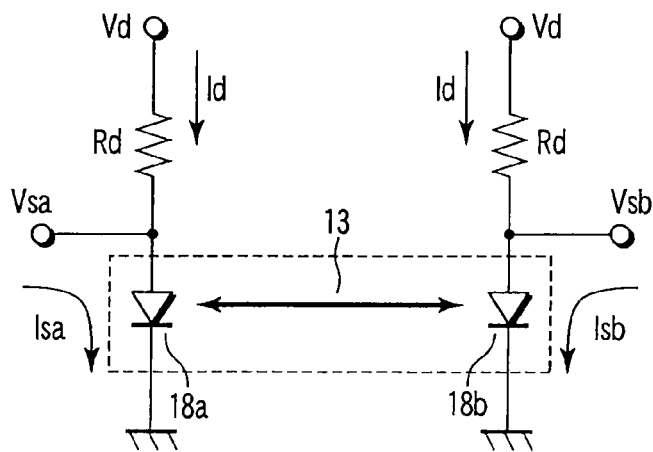
FIG. 5 is a circuit diagram illustrating a laser-induced optical wiring apparatus according to a second embodiment, which includes a circuit equivalent to the apparatus of FIG. 1, and a peripheral circuit.

FIG. 5 shows a laser-induced optical wiring apparatus according to a second embodiment. The second embodiment includes a circuit equivalent to the laser-induced optical wiring apparatus of FIGS. 1 to 3, and a peripheral circuit. However, it should be noted that the method for operating the apparatus is not limited to that described below, like the above-described operation method.

In FIG. 5, the circuit including the optical gain sections 18a and 18b and optical waveguide core 13 enclosed by the broken line is equivalent to the first embodiment shown in FIGS. 1 to 3. Bias resistors Rd may be located on or outside the substrate of the apparatus of FIG. 1. In the second embodiment, assume that the bias voltage applied to the bias resistor Rd connected in series to the optical gain section 18b is Vd, the bias current flowing through each bias resistor Rd is Id, the voltage applied at the connection terminal between the bias resistors Rd and optical gain sections 18a and 18b are Vsa and Vsb, respectively, and the currents flowing from the terminals Vsa and Vsb are Isa and Isb, respectively. The oscillation threshold values acquired when the same current is passed through the optical gain sections 18a and 18b are set as Ith and Vth that serve as the laser oscillation characteristics between the optical gain sections 18a and 18b. Namely, assume that the current corresponding to the oscillation threshold values is Ith/2 for each of the optical gain sections 18a and 18b.

As an operation example of the circuit, assume that Id is set to a value slightly lower than the threshold current value, e.g., 0.95×Ith/2 (=0.475 Ith), and that a current Is passing through the signal transmission side is sufficiently greater than Ith. In this state, when Is=0 (Isa=Isb=0), Vsa and Vsb are substantially equal to Vth. At this time, a current of Isa=2Ith as a signal is supplied to, for example, the optical gain section 18a side, whereby although the optical gain section 18b side is supplied with a current lower than the threshold value, the entire system assumes a laser oscillation enabled state as a result of the application of light from the optical gain section 18a side.

Upon occurrence of laser oscillation, the effective threshold value (the current value reaching the quantity of light corresponding to the oscillation threshold value) of the optical gain section 18b is reduced. This state is equivalent to the case where a bias current higher than the threshold value is supplied to the optical gain section 18b. Accordingly, the element voltage is reduced because of the principle previously described referring to FIG. 4. Namely, Vsb is reduced as a result of the supply of Isa, and a variation in Vsb is extracted to realize the transmission of a signal from the optical gain section 18a to the optical gain section 18b. In contrast, Vsa can be reduced as a result of the supply of Isb, thereby realizing signal transmission in the opposite direction.

Furthermore, Id may be preset to a value higher than Ith/2, e.g., Ith (the entire current is 2Ith) to make the system perform laser oscillation from the beginning, and Isa and Isb may be set to a negative current level (e.g., −Ith) that can stop laser oscillation. In this case, the phase of a signal output is opposite to that of the signal output acquired when a bias not higher than the threshold value is supplied.

Third Embodiment

Figure 6:
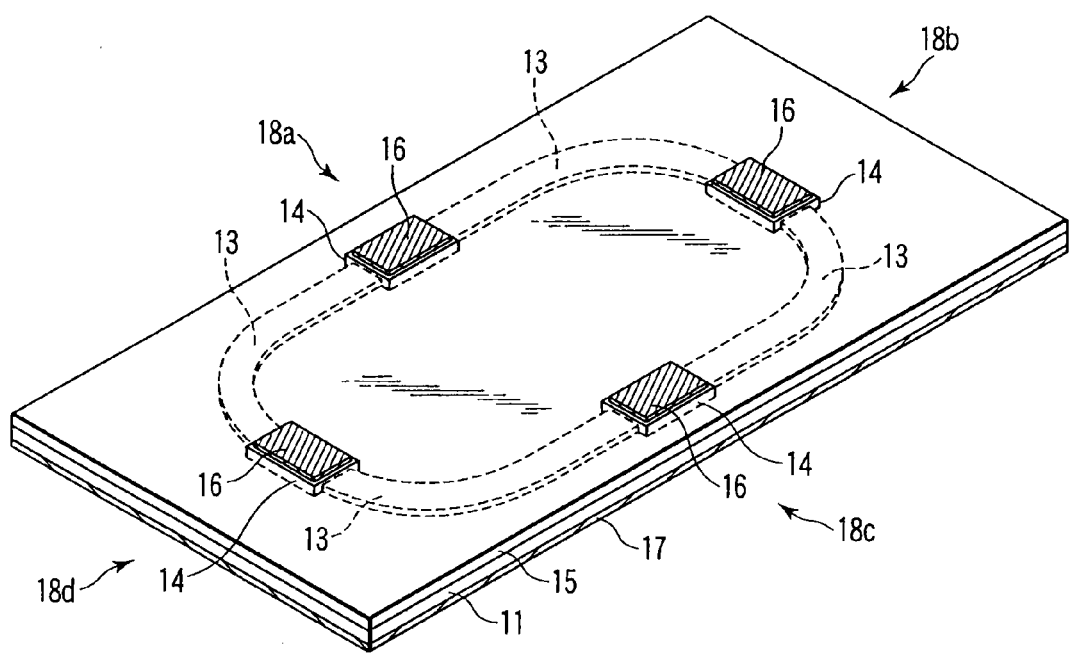
FIG. 6 is a schematic perspective view illustrating the structure of a laser-induced optical wiring apparatus according to a third embodiment.

FIG. 6 is a schematic perspective view illustrating the structure of a laser-induced optical wiring apparatus according to a third embodiment. In FIG. 6, elements similar to those of FIG. 2 are denoted by corresponding reference numbers, and no detailed description is given thereof.

In the first and second embodiments, signal transmission between two points has been described as an example. In the third embodiment, four optical gain sections are provided across the optical waveguide core 13, thereby enabling signal transmission between four points. Specifically, four GaInGsP active layers (not shown), four p-type InP clad layers and four p-type electrodes 16 are provided at four portions of the optical waveguide core 13, thereby providing four optical gain sections 18a, 18b, 18c and 18d.

The operation principle and method of the third embodiment are similar to those of the signal transmission between two points shown in FIGS. 1 to 5, and laser oscillation is executed if the optical gain acquired after light makes a circuit of the optical waveguide core 13 is not less than 1. Note that, in the third embodiment, signal transmission between an arbitrary node (optical gain section 18) and another arbitrary node cannot be executed, but that when an arbitrary node transmits a signal, all the remaining nodes receive it. This is a limitation on the circuit. In the third embodiment, however, this feature is positively utilized to realize the wiring structures shown in FIGS. 7 and 8.

Figure 7:
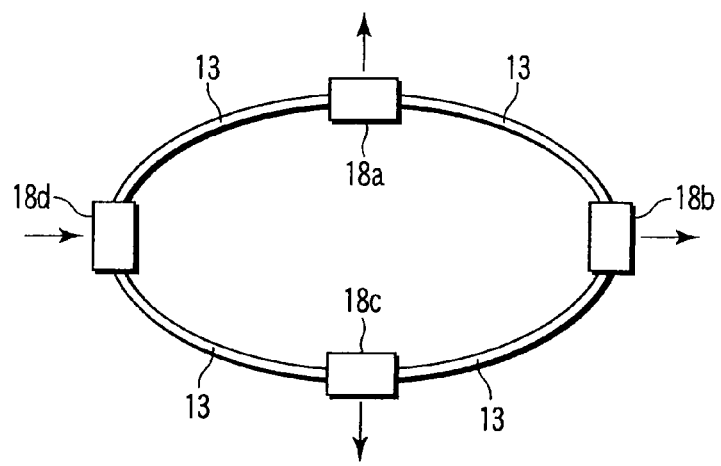
FIG. 7 is a schematic functional block diagram illustrating the structure of the laser-induced optical wiring apparatus of the third embodiment.

FIG. 7 shows a so-called broadcasting-type optical bus in which a signal is transmitted from a certain node (18d) and simultaneously received by the other nodes (18a, 18b and 18c). The broadcasting-type bus is used for multiprocessor connection of a tree-connection type, for clock distribution, etc.

Figure 8:
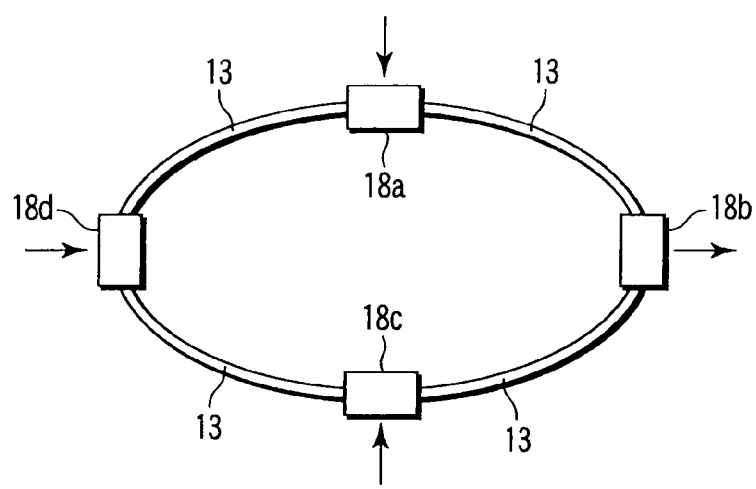
FIG. 8 is another schematic functional block diagram illustrating the structure of the laser-induced optical wiring apparatus of the third embodiment.

FIG. 8 shows a so-called wired OR circuit that performs logical OR processing on signals received from a large number of nodes. Since two-value signal wiring (digital wiring), in which two values ("1" or "0") indicate whether or not laser oscillation, is realized in the laser-induced optical wiring apparatus of the third embodiment, the OR output of a large number of inputs can be easily acquired. In the structure of FIG. 8, the nodes 18a, 18c and 18d are input nodes. When a signal is input to none of the input nodes, no change occurs in the output node 18b. However, when a signal is input to any one of the input nodes 18a to 18c, an output is acquired from the output node 18b. From this, it is understood that the circuit of FIG. 8 serves as a multi-input OR circuit. This circuit can be constructed such that an output is acquired from the output node 18b only when a signal is input to two or three of the input nodes 18a, 18c and 18d. In this case, the circuit serves as an AND circuit.

Whether the circuit of FIG. 8 serves as an OR circuit or AND circuit is selected by setting the threshold value of the laser oscillator. For instance, the circuit can be made to serve as an OR circuit, if bias voltages applied to all nodes are set to values extremely close to the threshold value, and the circuit is made to oscillate when any one of the nodes 18a, 18c and 18d receives a signal. Alternatively, the circuit can be made to serve as an AND circuit, if the bias voltages applied to all nodes are set to values slightly lower than in the case of the OR circuit, and the circuit is made to oscillate when two or three of the nodes 18a, 18c and 18d receive a signal.

Figure 9A:
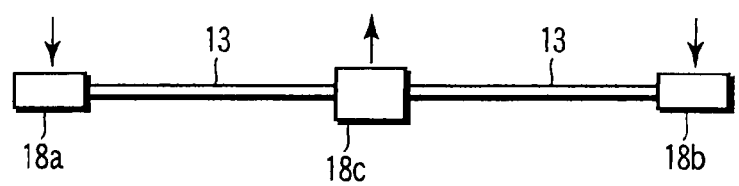
FIGS. 9A and 9B are schematic functional block diagrams illustrating the structures of laser-induced optical wiring apparatuses according to modifications of the third embodiment.
Figure 9B:
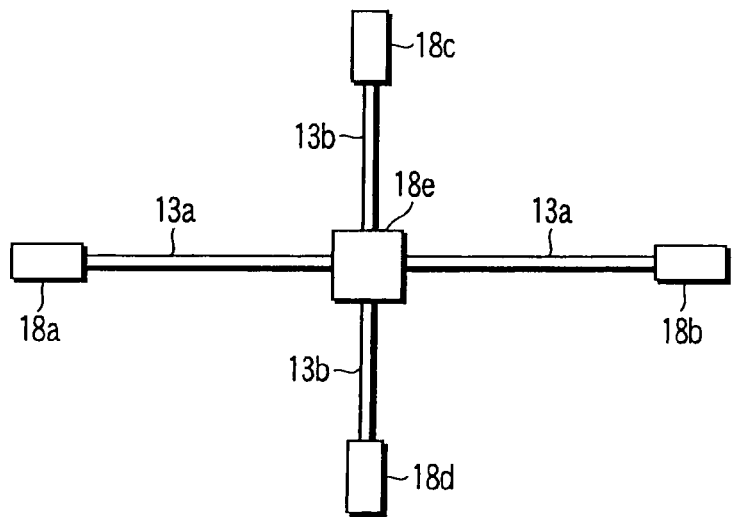

FIGS. 9A and 9B show a modification of the third embodiment, in which an optical waveguide with resonant mirrors is used instead of the ring optical waveguide, and three or more optical gain sections are provided, thereby realizing a logic circuit.

In the structure of FIG. 9A, nodes 18a and 18b are provided at the opposite ends of the linear optical waveguide core 13, and a node 18c is provided at the center of the optical waveguide core 13. In this case, for example, the nodes 18a and 18b serve as input nodes, and the node 18c serves as an output node. When a signal is input to both the input nodes 18a and 18b, an output is acquired from the output node 18c. Namely, this circuit serves as an AND circuit.

In the structure of FIG. 9B, the linear optical waveguide cores 13a and 13b intersect each other, and nodes 18a and 18b are provided at the opposite ends of the waveguide core 13a, and nodes 18c and 18d are provided at the opposite ends of the waveguide core 13b. Further, a further node 18e is provided at the intersection of the optical waveguide cores 13a and 13b. This structure can also be used as an AND circuit, when one (e.g., the node 18e) of the nodes 18a to 18e is used as an output nodes, and the other nodes are used as input nodes so that an output is acquired from the output node 18e when a signal is input to all input nodes 18a to 18d. Alternatively, when the threshold value of the laser oscillator is changed such that no change occurs in the output node 18e when no signal is input to the input nodes 18a to 18d, and an output is acquired from the output node 18e when a signal is input to any one of the input nodes 18a to 18d, the circuit can be used as a multi-input OR circuit.

Figure 10:
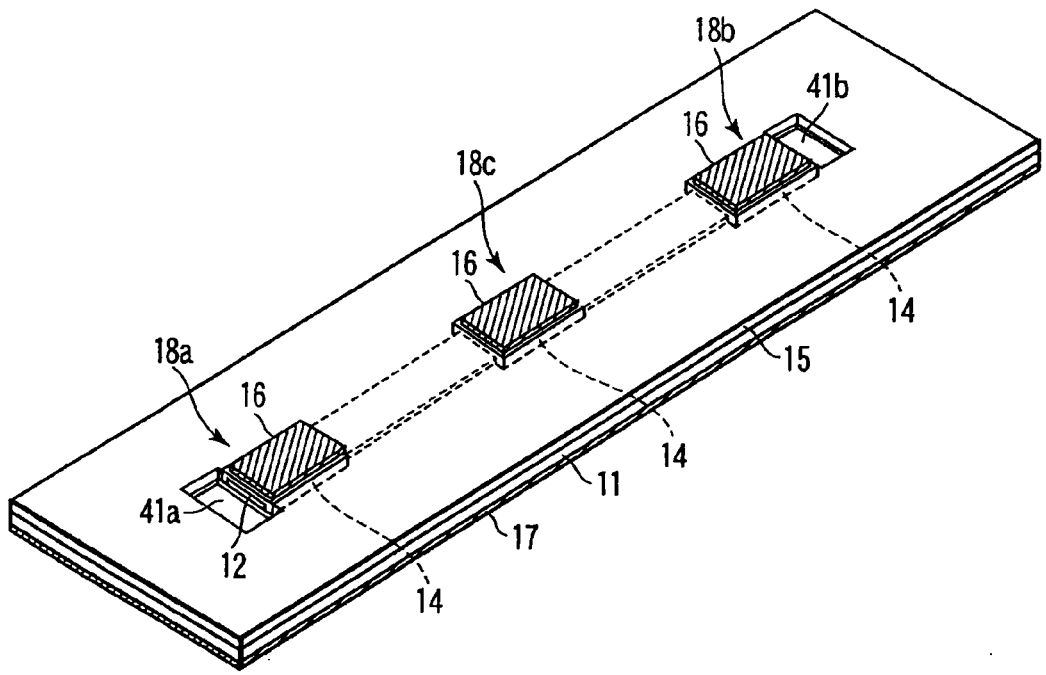
FIG. 10 is a schematic perspective view illustrating the structure of the laser-induced optical wiring apparatus corresponding to the functional block diagram of FIG. 9A.

To realize an optical waveguide using resonant mirrors, it is sufficient if the structure shown in FIG. 10 is employed. FIG. 10 is a schematic perspective view illustrating the structure of the laser-induced optical wiring apparatus corresponding to the functional block diagram of FIG. 9A.

This structure differs from that of FIG. 6 in that the optical waveguide core 13 is linear, and mirror units 41 (41a, 41b) formed by dry etching are provided at the opposite ends of the linear optical waveguide core 13. The mirrors 41 provide a so-called Fabry-Perote resonator. Basically, it is not necessary for the mirrors 41 to externally output light. Accordingly, a high reflection coat or metal coat (not shown) may be provided on the vertical end face of each mirror 41 to enhance the reflection ratio.

Further, the nodes 18a to 18c may be formed in the following manner. A first optical gain section (node 18a), which forms a laser oscillator along with the mirrors 41a and 41b and optical waveguide core 13, is provided at the mirror 41a side. Further, a second optical gain section (node 18b), which forms a laser oscillator along with the mirrors 41a and 41b and optical waveguide core 13, is provided at the mirror 41b side. In addition, a third optical gain section (node 18c), which forms a laser oscillator along with the mirrors 41a and 41b and optical waveguide core 13, is provided at the middle portion of the optical waveguide core 13.

Fourth Embodiment

Figure 11:
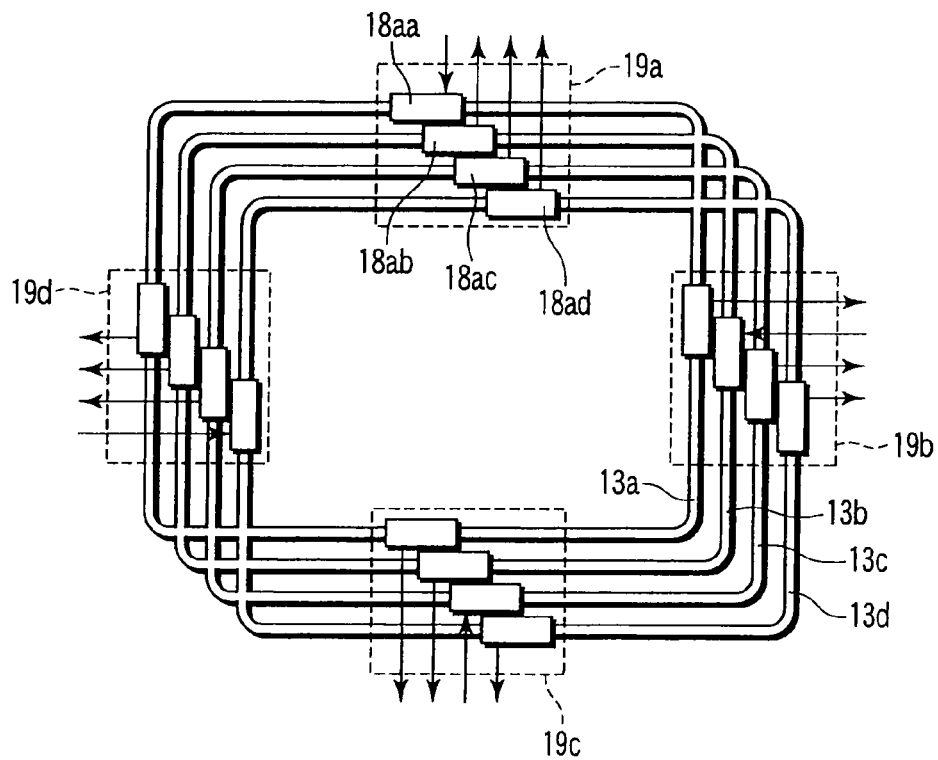
FIG. 11 is a schematic functional block diagram illustrating the structure of a laser-induced optical wiring apparatus according to a fourth embodiment.

FIG. 11 shows a fourth embodiment in which broadcast type buses as shown in FIG. 7 and corresponding to the number of I/O ports are arranged spatially parallel. Specifically, in FIG. 11, four I/O ports (19a, 19b, 19c and 19d) are provided, and four optical waveguide cores 13 (optical waveguide rings 13a to 13d) of the same length are arranged parallel. Further, each I/O port 19a to 19d incorporates four optical transmitting/receiving nodes corresponding to the respective four optical waveguide rings 13a to 13d. These nodes serve as input/output terminals. Each I/O port 19a to 19d exclusively uses one of the optical waveguide rings to transmit data, and uses the other optical waveguide rings to receive data from the other I/O ports.

For instance, the I/O port 19a is arranged to exclusively use the ring 13a to transmit data, using node 18aa as a transmission dedicated node and the other nodes 18ab to 18ad as reception dedicated nodes for receiving data from the I/O ports 19b to 19d (which exclusively use the rings b to d, respectively), respectively.

With this structure, each I/O port can simultaneously transmit data to the other I/O ports, and can receive all data from the other I/O ports. Namely, the structure of FIG. 11 realizes a so-called full-mesh bus that enables totally double type communication. This can realize a large-capacity multi-core processor that utilizes high-speed optical wiring.

In the embodiment of FIG. 11, since a plurality of optical waveguide cores 13 are arranged parallel, each waveguide core 13 intersects the other waveguide cores 13. However, no problem will occur if each waveguide core 13 perpendicularly intersects the other waveguide cores 13 as shown in FIG. 11. This is because perpendicularly intersecting light beams do not interfere with each other. Thus, when the optical lines are made to perpendicularly intersect each other, they function as independent lines.

Fifth Embodiment

FIG. 12 shows a fifth embodiment in which each optical gain section is utilized in common by a pair of adjacent optical waveguide rings. Each optical gain section is arranged to impart an optical gain to both the corresponding pair of adjacent optical waveguide rings.

Specifically, five optical waveguide rings 13 (13a to 13e) are connected in series, and incorporate optical gain sections 28 (28a to 28e). The opposite optical waveguide rings 13a and 13e have optical gain sections 28a and 28e. Further, an optical gain section 28ab is provided at the connection of the optical waveguide rings 13a and 13b. Similarly, an optical gain section 28bc is provided at the connection of the optical waveguide rings 13b and 13c, an optical gain section 28cd is provided at the connection of the optical waveguide rings 13c and 13d, and an optical gain section 28de is provided at the connection of the optical waveguide rings 13d and 13e.

Figure 13:
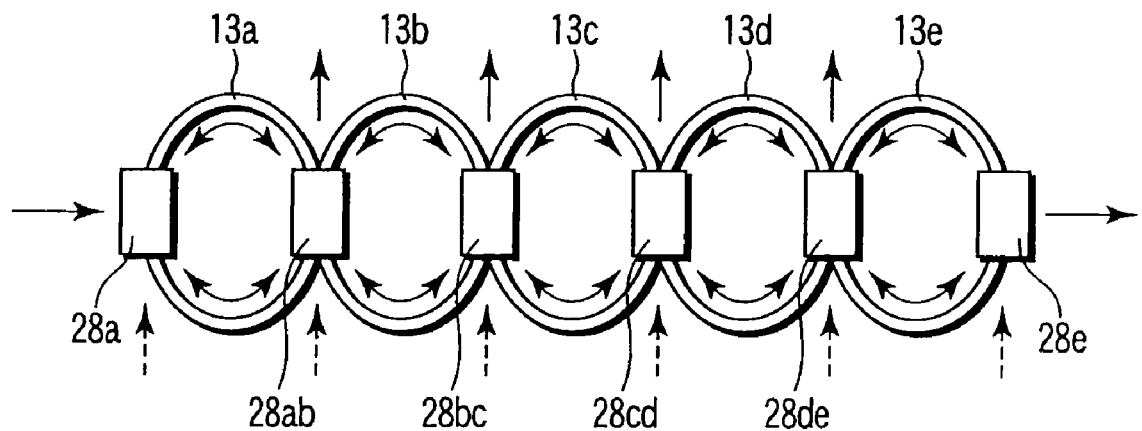
FIG. 13 is a schematic functional block diagram illustrating the structure of the laser-induced optical wiring apparatus according to the fifth embodiment.

In this embodiment, when a signal is input to the first optical gain section 28a as shown in FIG. 13, the optical waveguide ring 13a oscillates, whereby the next optical waveguide ring 13b oscillates. Thus, the optical waveguide rings 13a to 13e sequentially oscillate to thereby transmit the signal to the last optical gain section 28e. At this time, each optical gain section 28 at the connection of the corresponding optical waveguide rings 13 can output a signal to be propagated, and hence can also be used as a signal distributor. In FIG. 13, the solid-line arrows indicate signal flow, and the broken-line arrows indicate bias currents flowing into the optical gain sections.

Figure 14:
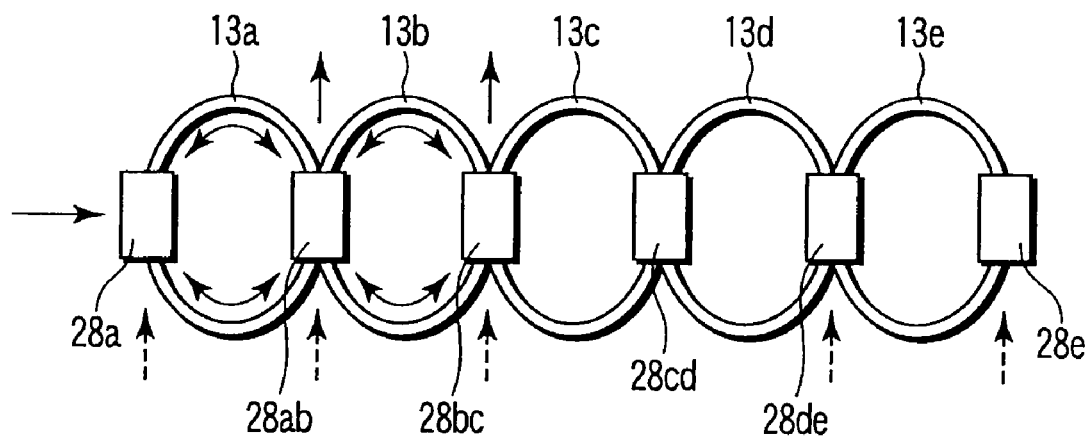
FIG. 14 is another schematic functional block diagram illustrating the structure of the laser-induced optical wiring apparatus according to the fifth embodiment.

Further, if the supply of a current to a certain optical gain section (in FIG. 14, the optical gain section 28cd) is interrupted as shown in FIG. 14, signal propagation is interrupted. Thus, the light-passing route can be controlled and altered. Namely, in the embodiment of FIG. 14, re-configurable optical wiring can be realized.

Sixth Embodiment

FIG. 15 shows a modification of the embodiment of FIG. 12, in which the optical waveguide rings 13 are optically independent of each other. Since, in the embodiment of FIG. 12, optical coupling occurs between the optical waveguide rings 13 that use a certain optical gain section 28 in common, when a certain optical waveguide ring 13 oscillates, the oscillation longitudinal mode (oscillation wavelength) of the next optical waveguide ring is normally locked. However, if the optical waveguide rings 13 have different optical path lengths, they have different oscillation modes and hence mode competition will occur. As a result, the laser oscillation may become unstable or beat waves may be superposed.

Figure 16:
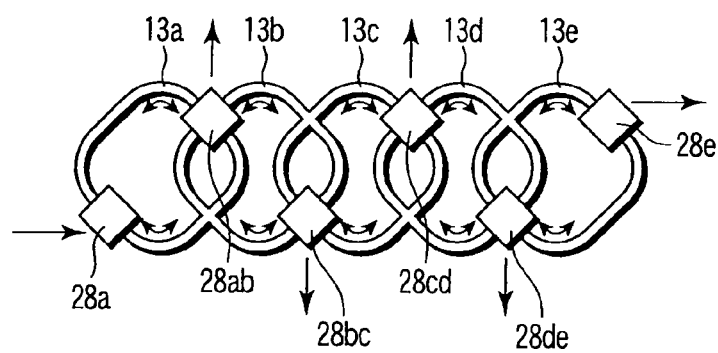
FIG. 16 is a schematic functional block diagram illustrating the structure of the laser-induced optical wiring apparatus according to the sixth embodiment.

To avoid such optical coupling, the structure of FIG. 15 employs perpendicularly intersecting optical waveguide rings. However, the optical gain sections 28 are provided at the intersections to enable signal propagation. In this structure, active layers 12 (not shown) are optically activated to thereby increase the number of carriers and hence increase the optical gain, thereby propagating laser oscillation between the optical waveguide rings. At this time, so as not to bias the optical gain of each optical waveguide ring 13, it is desirable to make constant the number of optical gain sections 28 included in each optical waveguide ring 13, and to realize symmetrical arrangement of the optical gain sections, as is shown in FIG. 16.

This structure provides the same advantages as in the fifth embodiment, and further enables a more stable operation without mode competition.

Seventh Embodiment

Figure 17:
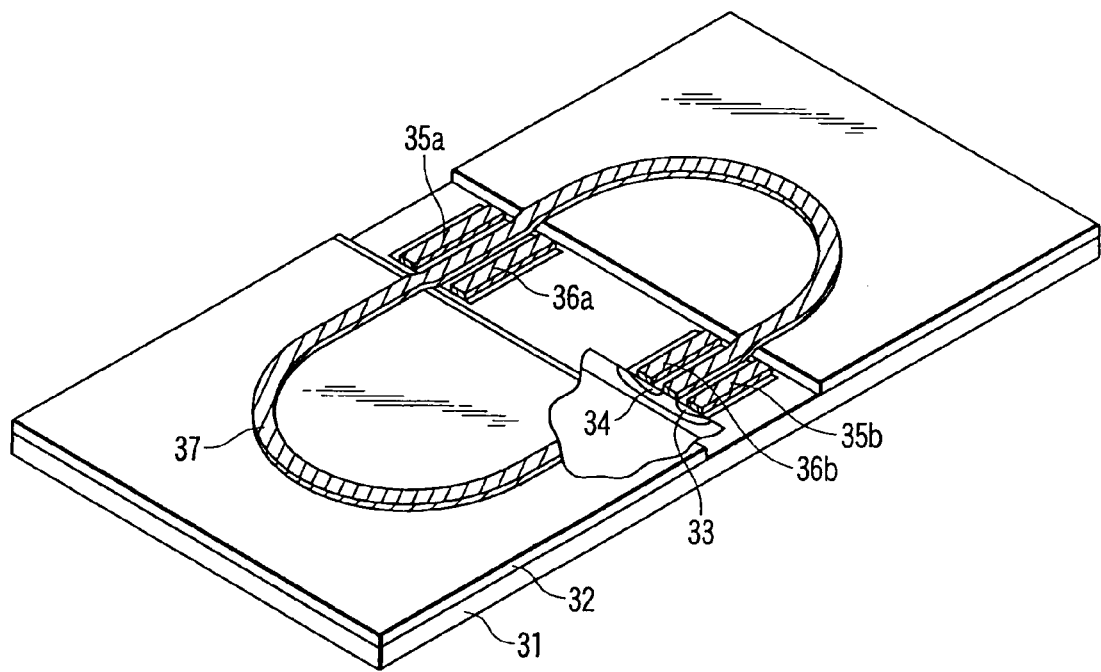
FIG. 17 is a partly broken perspective view illustrating the structure of a laser-induced optical wiring apparatus according to a seventh embodiment.

FIG. 17 is a partly broken perspective view illustrating the structure of a laser-induced optical wiring apparatus according to a seventh embodiment. The seventh embodiment employs a surface plasmon waveguide as an optical waveguide, in which laser active layers are formed of portions of an Si substrate, and the optical waveguide is formed of a metal thin film.

Specifically, in FIG. 17, reference numbers 31, 32, 33, 24, 35 (35a, 35b), 36 (36a, 36b) and 37 denote an Si substrate, $SiO_2$ cover, p-well, n-well, n electrodes, p electrodes, and surface plasmon guide (metal thin film), respectively.

Assume here that the electrodes 35 and 36 are formed of Al, and the surface plasmon guide 37 is formed of Au and has a thickness of 40 nm and a width of 2 μm. Assume further that the surface plasmon guide 37 is in the shape of a loop with a length of 200 μm, and provides an optical ring resonator. At this time, an $SiO_2$ insulation film of, for example, 20 nm is provided under the Au thin film. The Si emission section (laser activation section) is formed of the portion of the Si substrate located between the p-well 33 and n-well 34. When carriers are injected from the wells 33 and 34 into the emission section, optical re-coupling is performed.

When the p-well 33 or n-well 34 is formed, dopant paste mixed with $SiO_2$ particles, which have a diameter of about 10 nm, is coated by spin coating and thermally diffused, thereby forming convex and concave portions of several to several tens of nanometers in the surface of the diffusion layer. Utilizing the carrier blocking effect of the nano-scale convex and concave portions, optical re-coupling is accelerated. Further, rare-metal emission may be realized by injecting a rare-metal dopant into the Si emission section, or micro-sphere Si emission may be realized by providing nano-scale Si spheres coated with $SiO_2$ of several nanometers.

The surface plasmon is a type of polariton acquired by coupling light to various types of polarized waves, and serves as a light propagation mode coupled to the deviated polar of free electrons of a metal and propagating the surface of the metal. In general, the surface plasmon is called surface plasmon polariton (SPP). The light of SPP is captured at the boundary of a metal, and if the Si emission section is positioned in the photo-field, induced discharge can be realized.

In the seventh embodiment shown in FIG. 17, diodes are formed between the electrodes 35 and 36. When a forward current is passed through the diodes, they emit light. Further, when a current is passed between the electrodes 35a and 36a and between the electrodes 35b and 36b, both the active layers emit light, whereby laser oscillation using, as a resonator, the optical loop waveguide formed of the surface plasmon guide 37. Signal transmission between the optical gain section at the electrodes 35a and 36a and that at the electrodes 35b and 36b can be realized in the same manner as in the other embodiments described above.

MODIFICATION

The present invention is not limited to the above-described embodiments. The embodiments are mere examples. Other means (materials, sizes) may be additionally employed provided the scope of the invention is not departed from. For instance, in the embodiments, each optical gain section itself, which is included in a laser oscillator, detects an output signal. A photodetector for detecting light leaking from an optical waveguide to thereby detect an output signal may be provided near the waveguide. The waveguide structure and type may be selected in accordance with the installation place of the apparatus, peripheral conditions, etc. The materials, shapes, arrangements, etc. employed in the above-described embodiments are mere examples. Further, the embodiments may be appropriately combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A laser-induced optical wiring apparatus comprising:
a substrate;
an optical waveguide of a loop-shape provided on the substrate and forming an optical ring resonator;
an optical gain section provided across a portion of the optical waveguide and forming a laser oscillator along with the optical ring resonator; and
an optical switch provided across a portion of the optical waveguide separately from the optical gain section, the optical switch being configured to perform a switching operation to change a loss of an optical path of the optical ring resonator upon receiving an electric signal to change a laser oscillation state of the laser oscillator.

2. The apparatus according to claim 1, wherein the optical gain section is activated by a current supplied thereto, and a change in the laser oscillation state of the laser oscillator is detected from a change in a voltage applied to the optical gain section or in a current passing through the optical gain section.

3. The apparatus according to claim 1, wherein the optical switch is formed of a structure equivalent to the optical gain section, and the loss of the optical path is changed by changing an activation level of the optical switch.

4. The apparatus according to claim 1, wherein the optical waveguide is a surface plasmon waveguide.

5. The apparatus according to claim 2, wherein the optical switch is formed of a structure equivalent to the optical gain section, and the loss of the optical path is changed by changing an activation level of the optical switch.

6. The apparatus according to claim 2, wherein the optical waveguide is a surface plasmon waveguide.

7. The apparatus according to claim 3, wherein the optical gain section is activated to enable the laser oscillator to oscillate by a forward bias current or by a forward bias voltage, and a laser oscillation state of the laser oscillator is changed by changing an activation level of the optical gain section to change an optical path gain of the optical ring resonator.

8. The apparatus according to claim 7, wherein a change in the laser oscillation state is detected by the optical switch.

9. The apparatus according to claim 1, wherein the optical gain section is configured to output another electric signal.

10. The apparatus according to claim 2, wherein the optical gain section is configured to output another electric signal.

11. The apparatus according to claim 3, wherein the optical gain section is configured to output another electric signal.

12. A laser-induced optical wiring apparatus comprising:
a substrate;
an optical waveguide of a loop-shape provided on the substrate and forming an optical ring resonator;
an optical gain section provided across a portion of the optical waveguide, configured to output an electric signal and forming a laser oscillator along with the optical ring resonator; and
an optical switch provided across a portion of the optical waveguide separately from the optical gain section, the optical switch being configured to perform a switching operation to change a loss of an optical path of the optical ring resonator upon receiving a signal to change a laser oscillation state of the laser oscillator.

* * * * *